(12) United States Patent
Smith

(10) Patent No.: US 6,496,118 B1
(45) Date of Patent: Dec. 17, 2002

(54) COMPUTER CHIP HEAT PROTECTION APPARATUS

(76) Inventor: Warren L. Smith, 164 Harvard Rd., Watervliet, NY (US) 12189

( * ) Notice: Subject to any disclaimer, the term of this patent is extended or adjusted under 35 U.S.C. 154(b) by 0 days.

(21) Appl. No.: 09/953,001

(22) Filed: Sep. 11, 2001

(51) Int. Cl.[7] .............................................. G08B 17/00
(52) U.S. Cl. ..................................... 340/584; 340/588
(58) Field of Search ................................ 340/584, 590, 340/679, 693.5, 693.9, 588; 361/695, 717, 697, 696, 718, 719, 720; 374/185, 141, 183

(56) References Cited

U.S. PATENT DOCUMENTS

| 4,479,115 A | | 10/1984 | Holzhauer |
| 5,031,184 A | * | 7/1991 | Greve et al. ................. 257/712 |
| 5,355,121 A | | 10/1994 | Naito et al. |
| 5,448,143 A | | 9/1995 | Pecone |
| 5,612,677 A | * | 3/1997 | Baudry ......................... 340/521 |
| 5,714,938 A | | 2/1998 | Schwabl |
| 5,889,469 A | | 3/1999 | Mykytiuk et al. |
| 5,920,264 A | * | 7/1999 | Kim et al. |
| 5,930,736 A | | 7/1999 | Miller et al. |
| 6,020,820 A | * | 2/2000 | Chiang |
| 6,023,402 A | | 2/2000 | Kaminski |
| 6,052,597 A | * | 4/2000 | Ekstrom ....................... 342/367 |
| 6,092,926 A | * | 7/2000 | Still et al. .................... 340/584 |
| 6,384,731 B1 | * | 5/2002 | Sutherland .................... 338/26 |

* cited by examiner

Primary Examiner—Jeffery Hofsass
Assistant Examiner—Son Tang
(74) Attorney, Agent, or Firm—Dale J. Ream

(57) ABSTRACT

A heat protection apparatus includes a heat sink adapted for mounting to a computer chip for dissipating heat generated thereby, the heat sink having a base defining a channel peripherally thereabout. A cooling fan is mounted to the heat sink for dispersing the dissipated heat. The apparatus includes a logic circuit capable of evaluating resistance input data and capable of energizing an alarm upon a programmed condition. The apparatus includes a temperature sensitive polymeric tape spanning between a pair of conductors connected to the circuit. The conductors and polymeric tape are mounted in the channel. The circuit energizes the alarm if the resistance data indicates a temperature greater than a predetermined critical temperature parameter or if the data indicates a temperature rate of rise greater than a critical rate of rise parameter. The alarm may be audible or provide a visual indicator to a computer display.

17 Claims, 5 Drawing Sheets

COMPUTER CHIP HEAT PROTECTION APPARATUS

BACKGROUND OF THE INVENTION

The present invention relates generally to systems for monitoring thermal cooling in electronic devices and, more particularly, to a heat protection apparatus for protecting computer chips which monitors large increases in electronic resistance in the proximity of a computer chip.

A heat sink and fan are standard components within a computer system housing. The heat sink has multiple surfaces for dissipating heat generated by the computer chip and the fan disperses that dissipated heat. However, fan failure is a typical culprit for an increase in the temperature of a computer chip which ultimately leads to its premature demise. Various thermal monitoring devices have been proposed in the art which monitor a cooling fan, such as by monitoring fan wheel or air flow velocity. However, there are causes of a heat increase other than total fan failure, such as an increase in fan motor heat prior to failure, electrical surge, or an overall increase in ambient air temperature. Existing thermal detection devices for computer components do not adequately detect thermal increases caused by all possible sources.

Therefore, it is desirable to have a heat detection apparatus which provides a fast response to a predetermined temperature occurring along a continuous path in the proximity of a computer chip. Further, it is desirable to have a heat detection apparatus which detects an average temperature rate of rise that is greater than a predetermined rate of rise parameter.

SUMMARY OF THE INVENTION

A heat protection apparatus for protecting a computer chip according to the present invention includes a heat sink adapted to be mounted to a computer chip such as a central processor unit or other logic controller chip package. The heat sink includes multiple surfaces configured so as to dissipate heat generated by the computer chip during operation. The apparatus includes a cooling fan mounted to the heat sink for dispersing the dissipated heat into the surrounding ambient air. The heat sink includes a base in close proximity to the computer chip when mounted thereto, the base defining a channel about its lower peripheral edges. The apparatus includes a programmable logic circuit capable of evaluating electrical resistance input data supplied to it and comparing this data to predetermined parameters. The apparatus further includes a solid conductive positive temperature coefficient of resistance (PCTR) polymeric tape having opposed edges in contact with and enveloping respective conductors. The conductors are laterally spaced apart and the polymeric tape spans therebetween. The conductors and polymeric tape, also referred to herein as "the sensor", are positioned within the channel of the heat sink base and are characterized by changes in electrical resistance corresponding to temperature changes.

The conductors provide electrical resistance input data from the polymeric tape to the logic circuit for evaluation. The polymeric tape is capable of a massive increase in electric resistance at a predetermined temperature experienced therealong. When the resistance input data is evaluated by the logic circuit, an alarm is energized when the evaluated electric resistance is greater than a predetermined programmed critical resistance parameter. The logic circuit further includes a memory for storing resistance input data so that it can calculate and evaluate an average temperature rate of rise relative to the polymeric tape. The alarm is energized if the evaluated temperature rate of rise is greater than a predetermined rate of rise parameter. The alarm may be audible or may be in the form of a visual indicator that may be displayed upon the computer's display. It should also be appreciated that the computer chip being protected may itself serve as the logic circuit.

Therefore, a general object of this invention is to provide a heat protection apparatus which provides a swift warning when the temperature of a PTCR polymeric sensor positioned in close proximity to a computer chip and heat sink exceeds a predetermined critical temperature.

Another object of this invention is to provide a heat protection apparatus, as aforesaid, which energizes an alarm when an average temperature of a PTCR polymeric sensor positioned in proximity to a respective computer chip and heat sink rises at a rate greater than a predetermined rate of rise parameter.

Still another object of this invention is to provide a heat protection apparatus, as aforesaid, in which a PTCR polymeric sensor extends completely around a heat sink mounted to a computer chip to be protected.

Yet another object of this invention is to provide a heat protection apparatus, as aforesaid, that is easy and economical to manufacture and use.

A further object of this invention is to provide a heat protection apparatus, as aforesaid, which operates whenever a computer system in which the apparatus is installed is energized.

A still further object of this invention is to provide a heat protection apparatus, as aforesaid, having an audible or visual alarm to alert a user when a heat event is detected.

Another object of this invention is to provide a heat protection apparatus, as aforesaid, having a logic circuit that is programmable according to predetermined and user-selectable heat parameters.

Other objects and advantages of this invention will become apparent from the following description taken in connection with the accompanying drawings, wherein is set forth by way of illustration and example, embodiments of this invention.

DESCRIPTION OF THE PREFERRED EMBODIMENT

Figure 1:
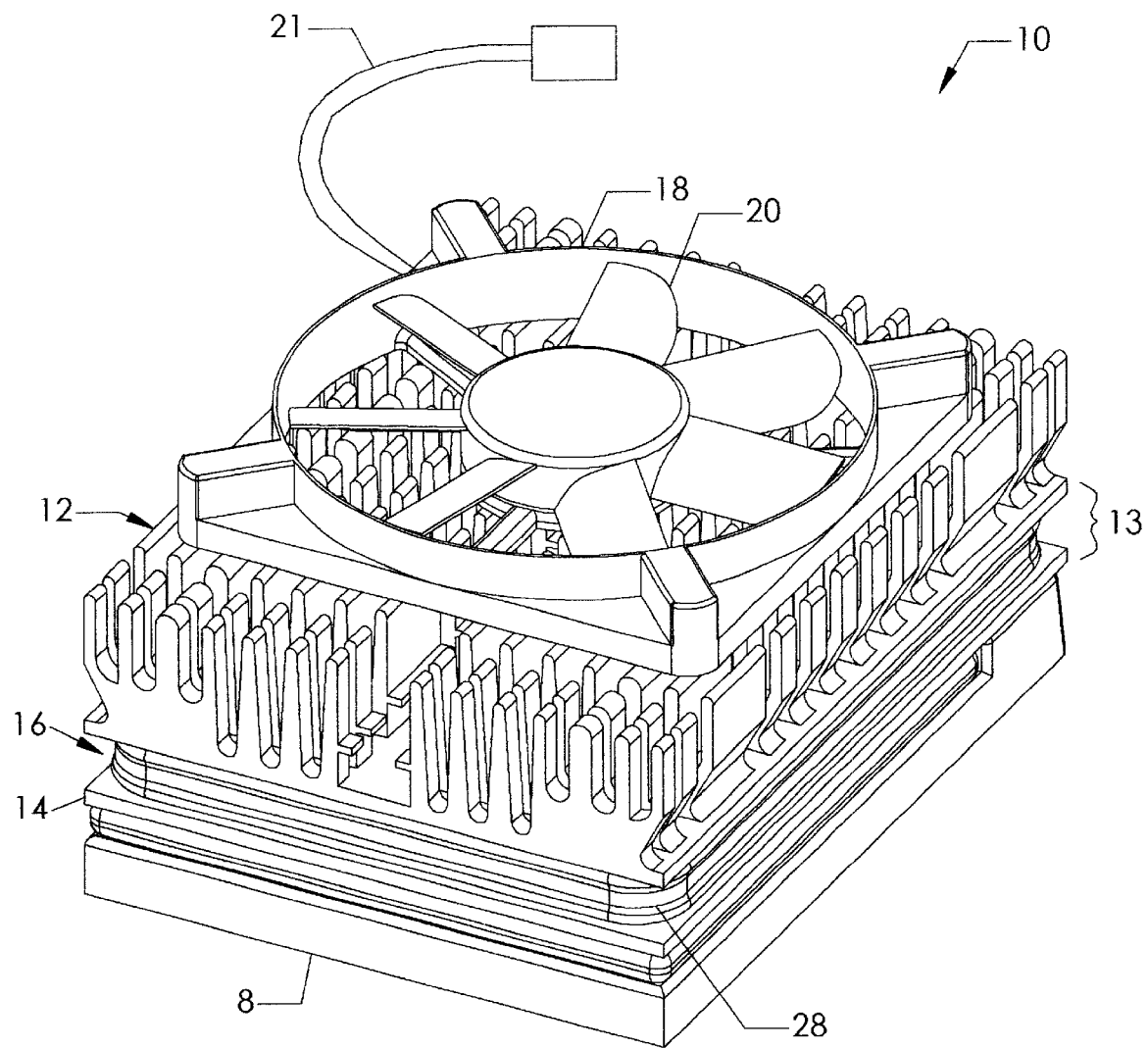
FIG. 1 is a perspective view of a heat protection apparatus according to one embodiment of the present invention.
Figure 2:
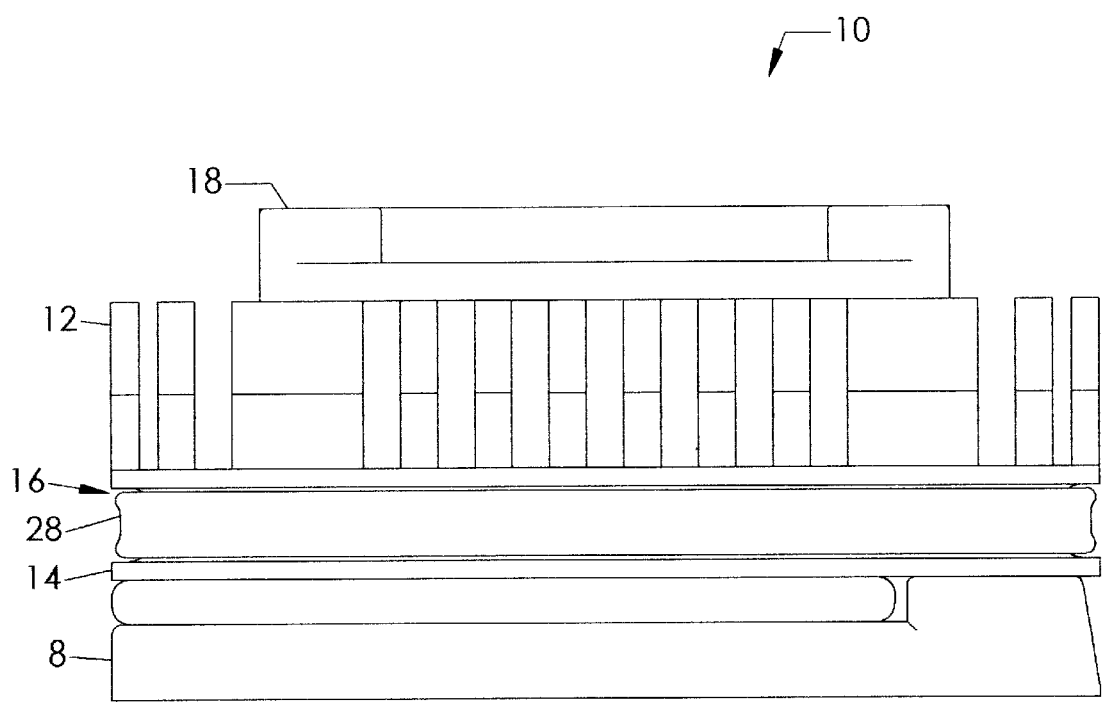
FIG. 2 is a side view of the heat protection apparatus as in FIG. 1.

A heat protection apparatus 10 according to a preferred embodiment of the present invention will now be described in detail with reference to FIGS. 1 through 4 of the accompanying drawings. The heat protection apparatus 10 includes a heat sink 12 positioned and mounted atop a computer chip 8 such as a central processing unit, micro-controller, or other computer chip package. The heat sink 12 includes a bottom surface 14 in direct contact with all or at least a portion of the computer chip 8 and includes a plurality of spaced apart upstanding walls extending upwardly from the bottom surface 14 (FIGS. 1 and 2). When the computer system housing the computer chip 8 is energized, the computer chip 8 generates heat. Some of this heat is immediately dissipated into the ambient air while some heat is transferred over time to the bottom surface 14 and upstanding walls of the heat sink 12 so as to dissipate the heat. The heat sink 12 includes a base 13 defining a channel 16 (also referred to as a groove) extending completely about the peripheral side walls thereof adjacent the bottom surface 14 of the heat sink 12.

A cooling fan 18 is mounted atop the heat sink 12, preferably with fasteners such as screws (not shown) although it may be integrally molded as part of the heat sink 12. The cooling fan 18 includes a motor and a plurality of blades 20 which rotate so as to dissipate heat from the heat sink 12 into the surrounding air (FIG. 1). A power cord 21 extends from the fan to a power source within the computer or to an external power source.

The heat protection apparatus 10 includes a programmable logic circuit 22 capable of evaluating resistance input data supplied to it and capable of comparing the evaluated data to various predetermined parameters. Some of the evaluations, however, may be performed with a circuit that is not programmable. The logic circuit 22 may be attached to the computer motherboard or mounted within a separate housing. The logic circuit 22 may be electrically connected to a computer's battery source 24 (FIG. 3) although it could also be energized by a separate power source.

The heat protection apparatus 10 further includes a temperature sensor 26 positioned in the channel 16 extending about the peripheral sides of the heat sink 12. The temperature sensor 26 includes a solid, temperature sensitive material in the form of a conductive positive temperature coefficient of resistance (PCTR) polymeric tape 28 having an elongate and generally flat construction. The PTCR polymeric tape 28 includes opposed edges 30 that extend longitudinally. The PTCR polymeric tape 28 provides a massive increase in electrical resistance at a predetermined temperature, the transition temperature being determined by the polymeric formulation of the tape.

Figure 5:
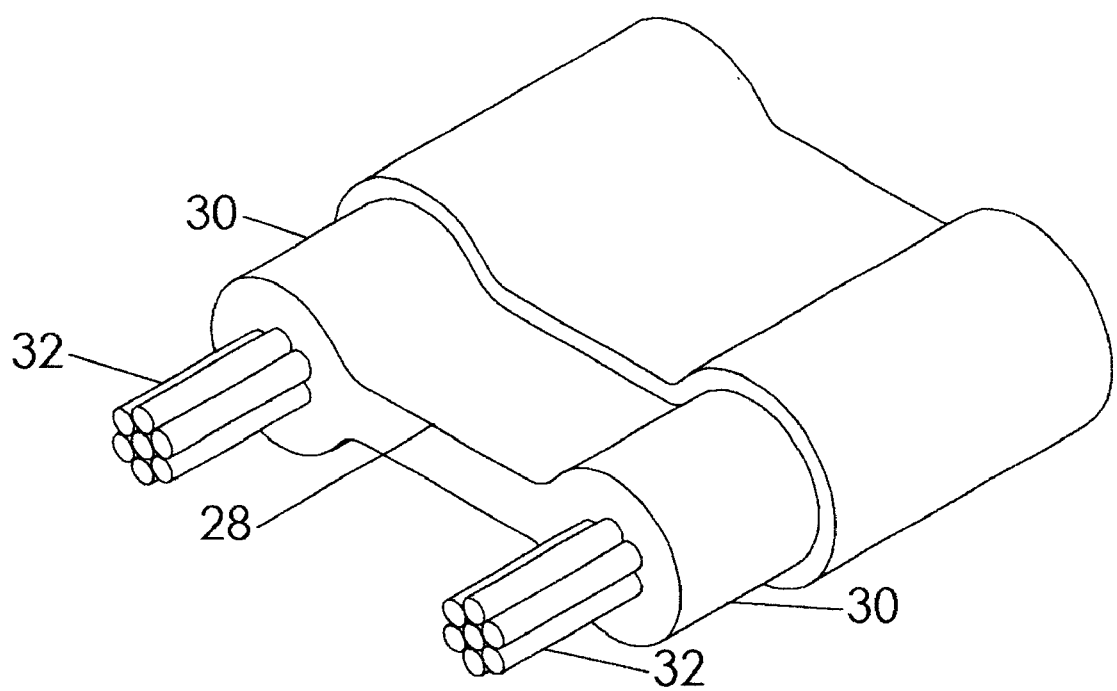
FIG. 5 is a fragmentary perspective view of a portion of the polymeric tape on an enlarged scale of the heat sensor.

The heat protection apparatus 10 further includes a pair of electrical conductors 32 in the form of elongate wires that are spaced apart and extend in parallel relationship relative to one another. Each conductor 32 is enveloped by a respective edge of the PTCR polymeric tape 28 such that the conductor 32 is in contact therewith and such that the tape 28 spans between the conductors 32 (FIG. 5). The conductors 32 extend from each end of the polymeric tape 28 and are electrically connected to the logic circuit 22 so as to deliver resistance input data from the polymeric tape 28 to the logic circuit 22 for evaluation, as to be described in further detail below. Therefore, the sensor 26, which includes the PTCR polymeric tape 28 and pair of conductors 32. may extend from the logic circuit 22 preferably along all sides of the heat sink 12 and then back to the logic circuit 22 (FIG. 2). It is understood, however, that the sensor 26 need only extend along at least one side of the heat sink 12 or be in close proximity thereto.

The sensor 26 functions as a plurality of sensing cells in a parallel configuration. By evaluating resistance input data provided by input leads of the conductors 32 and by comparison with predetermined parameters stored in a memory within or connected to the logic circuit 22, the logic circuit 22 can determine if a predetermined critical temperature has been reached at some point on the polymeric tape 28. The critical temperature at which the resistance of the PTCR polymeric tape 28 dramatically increases depends on its polymeric formulation. When a critical temperature is detected due to a spike in resistance, an alarm 38 (FIG. 3) is energized (FIG. 4). This alarm condition is indicated at reference numeral 34 (FIG. 4). It should be appreciated that the predetermined critical temperature may be quite high so as to prevent false alarms on warm days and since computer chips generally do not fail under moderately warm temperatures.

The logic circuit 22 includes a memory (not shown) for storing resistance input data. Based on data stored in this memory, the logic circuit 22 can evaluate the rate at which the overall temperature of the tape is rising. If evaluation of the resistance data relative to the parallel sensing cells of the polymeric tape 28 indicates a temperature rate of rise that is greater than a predetermined critical temperature rate of rise parameter, then the alarm 38 is energized because such a fast temperature increase indicates a chip overheat or even a fire condition as opposed to a mere climate change. This alarm condition is identified at reference numeral 36 (FIG. 4). It should be appreciated that the rate of rise alarm condition 36 may occur before the critical temperature alarm condition 34 is encountered (i.e. at a temperature that is lower than the critical temperature parameter).

Figure 3:
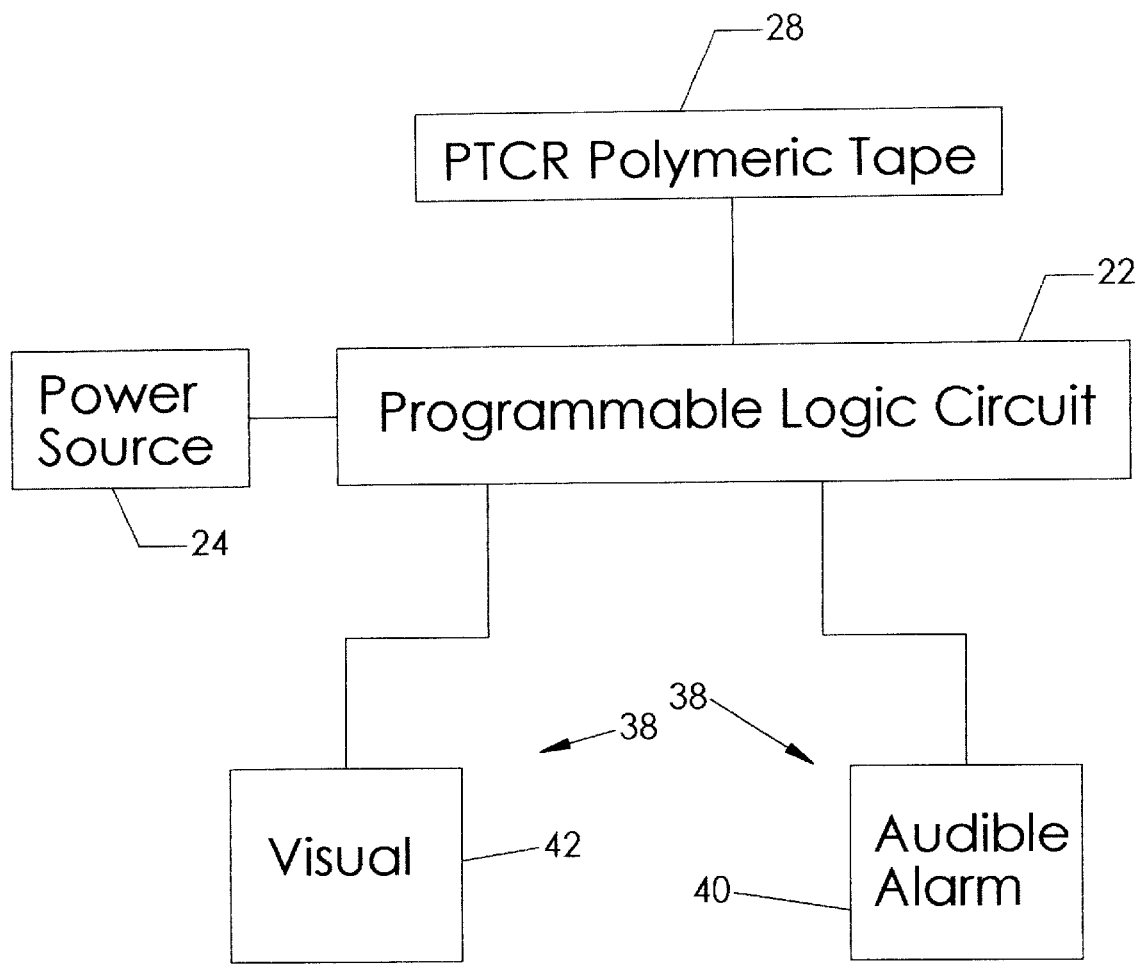
FIG. 3 is a block diagram of the sensor and logic circuit of the heat protection apparatus as in FIG. 1.
Figure 4:
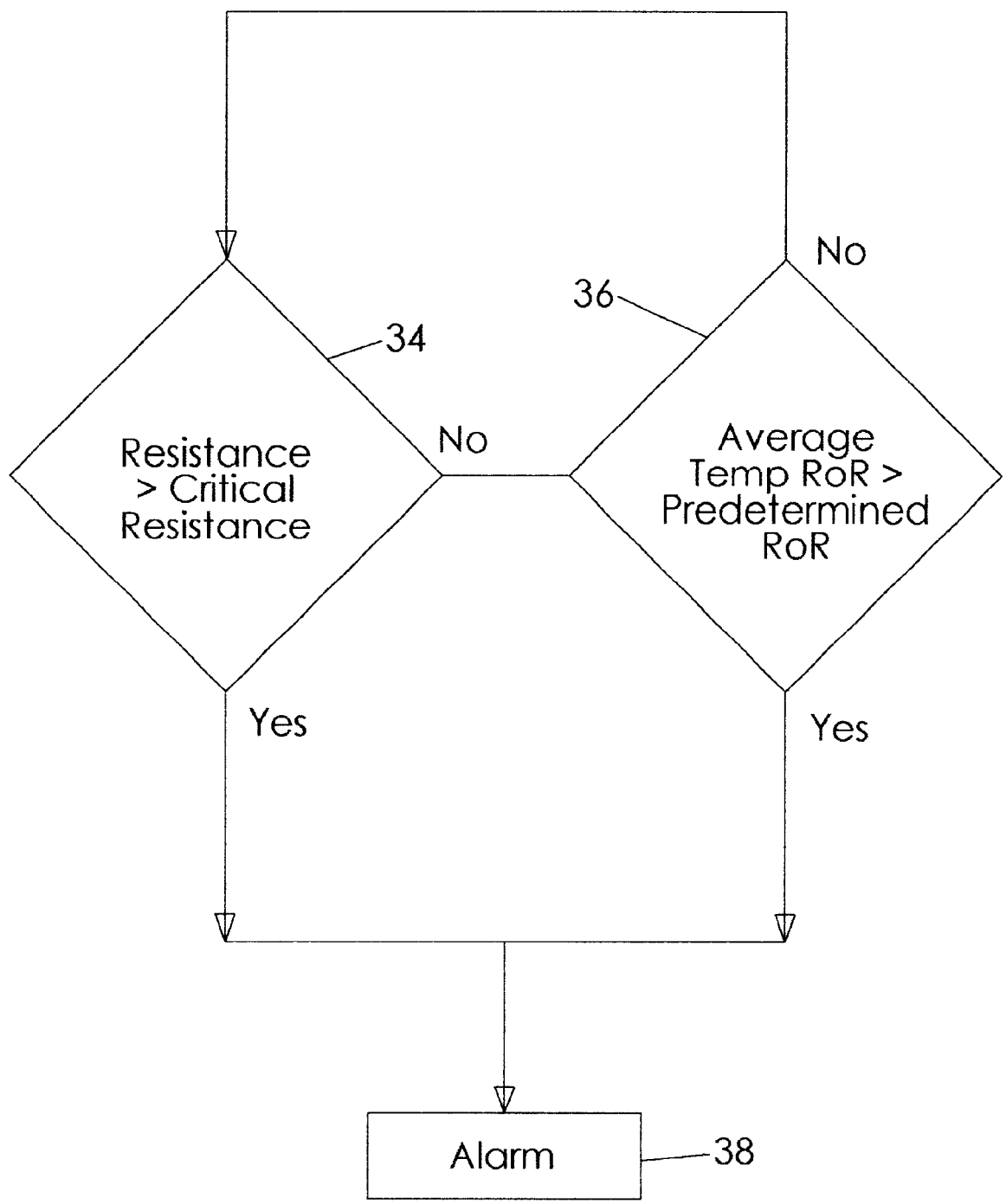
FIG. 4 is a flowchart showing the logic utilized by the logic circuit.

When either type of alarm condition is detected, the logic circuit 22 energizes the alarm 38 (FIG. 3). The alarm 38 may be an audible alarm 40 such as a piezoelectric buzzer or even a computer's own speech generator and speaker. The alarm 38 may also be a visual indicator 42 that may be displayed on a computer's display. Obviously, the logic circuit 22 may be connected to the computer display or to the computer's central processing unit to facilitate the visual alarm.

In another embodiment of this invention (not shown), the PTCR polymeric tape 28 may be directly connected to a computer's central processing unit rather than to a separate programmable logic circuit 22. The central processing unit may be programmed to make the evaluations and comparisons described above and predetermined parameters may be stored in the computer's general purpose memory.

Accordingly, the heat protection apparatus 10 provides a fast response to conditions that may cause a computer chip to overheat and hence fail. This type of condition can be sensed whether it is caused by cooling fan failure, electric surge, or other causes. Further, the present apparatus is simple to manufacture and install as it requires minimal electronic and sensing components.

It is understood that while certain forms of this invention have been illustrated and described, it is not limited thereto except insofar as such limitations are included in the following claims and allowable functional equivalents thereof.

Having thus described the invention, what is claimed as new and desired to be secured by Letters Patent is as follows:

1. A heat protection apparatus for a CPU computer chip, comprising:

a heat sink adapted to be mounted to the CPU computer chip and having a plurality of surfaces for dissipating heat generated by the CPU computer chip, said heat sink having a base defining a groove peripheral therearound;

a cooling fan assembly adapted to be mounted to said heat sink for dispersing the heat dissipated by said heat sink into the surrounding air;

an alarm;

a logic circuit capable of evaluating resistance input data supplied thereto, said logic circuit including means for generating an output signal to energize said alarm;

a pair of electrical conductors extending along said groove, said pair of electrical conductors being spaced apart and extending parallel to one another, each conductor being electrically connected to said logic circuit for providing said resistance input data thereto;

a power source electrically connected to said logic circuit and said alarm;

a solid conductive PTCR polymeric tape positioned there-around in said groove and having opposed longitudinal edges in contact with said pair of electrical conductors and spanning therebetween, said PTCR polymeric tape being conductive and capable of a massive increase in electrical resistance at a predetermined temperature at any location along said PTCR polymeric tape where said predetermined temperature occurs; and said pair of conductors providing said resistance input data to said logic circuit for evaluation indicative of a resistance of said PTCR polymeric tape, said logic circuit including means for comparing said resistance with a predetermined resistance parameter, said logic circuit adapted to generate said output signal for energizing said alarm if said evaluated resistance input data indicates a resistance greater than said predetermined resistance parameter.

2. The heat protection apparatus as in claim 1 wherein said PTCR polymeric tape further comprises a temperature sensing cell in parallel therealong that is capable of an increase in electrical resistance upon an increase in an average temperature thereof, said pair of conductors providing said resistance input data to said logic circuit for evaluation indicative of an average temperature rate of rise of said sensing cell of said PTCR polymeric tape, said logic circuit including means for comparing said average temperature rate of rise with a predetermined critical rate of rise parameter, said logic circuit adapted to generate said output signal for energizing said alarm if said evaluated resistance input data relative to said sensing cell indicates an average temperature rate of rise greater than said critical temperature rate of rise parameter.

3. The heat protection apparatus as in claim 2 wherein said logic circuit further comprises a memory for storing said resistance input data from said pair of conductors, said logic circuit including means for calculating said average temperature rate of rise using said stored resistance input data.

4. The heat protection apparatus as in claim 1 wherein said power source is a battery.

5. The heat protection apparatus as in claim 1 wherein said pair of conductors and said PTCR polymeric tape form an elongate and generally flat construction.

6. The heat protection apparatus as in claim 1 wherein said alarm is a visual indicator, said logic circuit being electrically connected to a computer display such that said visual indicator is selectively displayed thereon when said output signal is generated.

7. The heat protection apparatus as in claim 1 wherein said PTCR polymeric tape further comprises a temperature sensing cell in parallel therealong that is capable of an increase in electrical resistance upon an increase in an average temperature thereof, said pair of conductors being electrically connected to the CPU computer chip for providing said resistance input data thereto for evaluation indicative of an average temperature rate of rise of said sensing cell of said PTCR polymeric tape, said CPU computer chip including means for comparing said average temperature rate of rise with a predetermined critical rate of rise parameter, said logic circuit adapted to generate said output signal for energizing said alarm if said evaluated resistance input data relative to said sensing cell indicates an average temperature rate of rise greater than said critical temperature rate of rise parameter.

8. A heat protection apparatus for use with a CPU computer chip, comprising:

a heat sink adapted to be mounted to the CPU computer chip and having a plurality of surfaces for dissipating heat generated by the CPU computer chip, said heat sink having a base defining a channel peripherally there-around;

a cooling fan assembly adapted to be mounted to said heat sink for dispersing the heat dissipated by said heat sink into the surrounding air;

an alarm;

a logic circuit capable of evaluating resistance input data supplied thereto, said logic circuit including means for generating an output signal to energize said alarm;

a pair of electrical conductors positioned in said channel along at least one side of said base, said pair of electrical conductors being spaced apart and extending parallel to one another, each conductor being electrically connected to said logic circuit for providing said resistance input data thereto;

a battery power source electrically connected to said logic circuit and said alarm;

a solid conductive PTCR polymeric tape positioned there-around in said channel and having opposed longitudinal edges in contact with and enveloping said pair of electrical conductors and spanning therebetween, said PTCR polymeric tape being conductive and capable of a massive increase in electrical resistance at a predetermined temperature at any location along said PTCR polymeric tape where said predetermined temperature occurs;

said pair of conductors providing said resistance input data to said logic circuit for evaluation indicative of a resistance of said PTCR polymeric tape, said logic circuit including means for comparing said resistance with a predetermined resistance parameter, said logic circuit generating said output signal for energizing said alarm if said evaluated resistance input data indicates a resistance greater than said predetermined resistance parameter; and said PTCR polymeric tape including a temperature sensing cell arranged in parallel therealong that is capable of an increase in electrical resistance upon an increase in an average temperature thereof, said pair of conductors providing said resistance input data to said logic circuit for evaluation indicative of an average temperature rate of rise of said sensing cell of said PTCR polymeric tape, said logic circuit including means for comparing said average temperature rate of rise with a predetermined critical rate of rise parameter, said logic circuit generating said output signal for energizing said alarm if said evaluated resistance input data relative to said sensing cell indicates an average temperature rate of rise greater than said critical temperature rate of rise parameter.

9. The heat protection apparatus as in claim 8 wherein said logic circuit further comprises a memory for storing said resistance input data from said pair of conductors, said logic circuit including means for calculating said average temperature rate of rise using said stored resistance input data.

10. The heat protection apparatus as in claim 8 wherein said pair of conductors and said PTCR polymeric tape form an elongate and generally flat construction.

11. The heat protection apparatus as in claim 8 wherein said alarm includes a visual indicator, said logic circuit being electrically connected to a computer display and adapted to selectively display said visual indicator thereon when said output signal is generated.

12. The heat protection apparatus as in claim 8 wherein said alarm includes an audible alarm.

13. The heat protection apparatus as in claim 8 wherein said pair of electrical conductors are positioned in said channel along all sides of said base of said heat sink.

14. A heat detection apparatus for use with a computer chip, comprising:

a heat sink adapted to be mounted to a computer chip and having a plurality of surfaces for dissipating heat generated by said computer chip, said heat sink having a base defining a channel peripherally there-around;

a cooling fan assembly adapted to be mounted to said heat sink for dispersing the heat dissipated by said heat sink into the surrounding air;

an alarm;

means in said computer chip for evaluating resistance input data and for generating an output signal to energize said alarm;

a pair of electrical conductors positioned in said channel, said pair of electrical conductors being spaced apart and extending parallel to one another, each conductor being electrically connected to said computer chip for providing said resistance input data thereto;

a power source electrically connected to said computer chip and said alarm;

a solid conductive PTCR polymeric tape positioned there-around in said channel and having opposed longitudinal edges in contact with and enveloping said pair of electrical conductors and spanning therebetween, said PTCR polymeric tape being conductive and capable of a massive increase in electrical resistance at a predetermined temperature at any location along said PTCR polymeric tape where said predetermined temperature occurs; and said pair of conductors providing said resistance input data to said computer chip for evaluation indicative of a resistance of said PTCR polymeric tape, said computer chip including means for comparing said resistance with a predetermined resistance parameter, said computer chip generating said output signal for energizing said alarm if said evaluated resistance input data indicates a resistance greater than said predetermined resistance parameter.

15. The heat detection apparatus as in claim 14 wherein said PTCR polymeric tape further comprises a temperature sensing cell arranged in parallel therealong that is capable of an increase in electrical resistance upon an increase in an average temperature thereof, said pair of conductors providing said resistance input data to said computer chip for evaluation indicative of an average temperature rate of rise of said sensing cell of said PTCR polymeric tape, said computer chip including means for comparing said average temperature rate of rise with a predetermined critical rate of rise parameter, said computer chip generating said output signal for energizing said alarm if said evaluated resistance input data relative to said sensing cell indicates an average temperature rate of rise greater than said critical temperature rate of rise parameter.

16. The heat detection apparatus as in claim 15 wherein said computer chip further comprises a memory for storing said resistance input data from said pair of conductors, said computer chip including means for calculating said average temperature rate of rise using said stored resistance input data.

17. The heat detection apparatus as in claim 15 wherein said alarm is a visual indicator, said computer chip being electrically connected to a computer display such that said visual indicator is selectively displayed thereon when said output signal is generated.

* * * * *